(12) United States Patent
Edelstein et al.

(10) Patent No.: US 6,437,568 B1
(45) Date of Patent: Aug. 20, 2002

(54) LOW NOISE MRI SCANNER

(75) Inventors: William Alan Edelstein, Schenectady; Richard Philip Mallozzi; Robert Arvin Hedeen, both of Clifton Park; Sayed-Amr El-Hamamsy, Niskayuna; Mark Lloyd Miller, Schenectady; Paul Shadforth Thompson, Stephentown; Robert Adolph Ackermann, Schenectady; Bruce Campbell Amm, Clifton Park; John Peter Fura, Ballston Lake, all of NY (US); Mike James Radziun, Waterford, WI (US); David Edward Dean, Hartland, WI (US); Scott Thomas Mansell, Waterford, WI (US); Dewain Anthony Purgill; Robert Michael Vavrek, both of Waukesha, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/676,945

(22) Filed: Oct. 2, 2000

(51) Int. Cl.$^7$ ................................................. G01V 3/00
(52) U.S. Cl. ........................ 324/318; 324/309; 324/319; 324/322
(58) Field of Search ................................. 324/309, 318, 324/319, 322, 300

(56) References Cited

U.S. PATENT DOCUMENTS

| 4,840,700 A | 6/1989 | Edelstein et al. ............ 156/634 |
| 5,489,848 A | 2/1996 | Furukawa .................... 324/318 |
| 5,570,021 A | 10/1996 | Dachniwskyj et al. ...... 324/318 |
| 5,760,584 A | 6/1998 | Frederick .................... 324/318 |
| 5,793,210 A | 8/1998 | Pla et al. ..................... 324/318 |
| 5,990,681 A | * 11/1999 | Richard et al. ............. 324/318 |
| 6,043,653 A | * 3/2000 | Takamori et al. ........... 324/309 |
| 6,157,276 A | 12/2000 | Hedeen et al. .............. 335/216 |

* cited by examiner

Primary Examiner—Edward Lefkowitz
Assistant Examiner—Brij B. Shrivastav
(74) Attorney, Agent, or Firm—Jean K. Testa; Jill M. Breedlove

(57) ABSTRACT

A low noise imaging apparatus for producing Magnetic Resonance (MR) images of a subject and for substantially minimizing acoustic noise generated during imaging is provided. The imaging apparatus comprises a magnet assembly, a gradient coil assembly, and a rf coil assembly, wherein at least one of the magnet assembly, the gradient coil assembly and the rf coil assembly are configured to reduce the generation and transmission of acoustic noise.

17 Claims, 5 Drawing Sheets

LOW NOISE MRI SCANNER

BACKGROUND OF THE INVENTION

The present invention relates generally to a magnetic resonance imaging (MRI) scanner and more particularly to a low-noise MRI scanner.

MRI scanners, which are used in various fields such as medical diagnostics, typically use a computer to create images based on the operation of a magnet, a gradient coil assembly, and a radiofrequency coil(s). The magnet creates a uniform main magnetic field that makes nuclei, such as hydrogen atomic nuclei, responsive to radiofrequency excitation. The gradient coil assembly imposes a series of pulsed, spatial-gradient magnetic fields upon the main magnetic field to give each point in the imaging volume a spatial identity corresponding to its unique set of magnetic fields during the imaging pulse sequence. The radiofrequency coil creates an excitation frequency pulse that temporarily creates an oscillating transverse magnetization which is detected by the radiofrequency coil and used by the computer to create the image. Typically, there is a radiofrequency coil and a gradient coil assembly within the magnet.

Magnets for MRI scanners include superconductive-coil magnets, resistive-coil magnets, and permanent magnets. Known superconductive magnets include liquid-helium cooled and cryocooler-cooled superconductive magnets. Known superconductive magnet designs include cylindrical magnets and open magnets.

Cylindrical magnets typically are cylindrically shaped and have an axially-directed static magnetic field. In MRI systems based on cylindrical magnets, the radiofrequency coil, the gradient coil assembly and the magnet are generally annularly-cylindrical shaped and are generally coaxially aligned, wherein the gradient coil assembly circumferentially surrounds the radiofrequency coil and wherein the magnet circumferentially surrounds the gradient coil assembly.

Open magnets typically employ two spaced-apart magnetic assemblies with the space between the assemblies allowing for access by medical personnel for surgery or other medical procedures during MRI imaging. The open space helps the patient overcome feelings of claustrophobia that may be experienced in a cylindrical magnet design.

Generally, the various components of the MRI scanner represent sources and pathways of acoustic noise that can be objectionable to the patient being imaged and to the user of the scanner. For example, the gradient coil assemblies of MRI scanners generate loud acoustic noises which many medical patients find objectionable. The acoustic noises occur internal to the patient bore of the scanner as well as outside of the scanner. Active noise control techniques have been used to reduce gradient coil assembly noise including noise-canceling patient earphones. Known passive noise control techniques include locating the gradient coil assembly in a vacuum enclosure.

The rf coil structure is also another source of vibration land acoustic noise. An MRI system employs electrically excited gradient coils to impose time varying magnetic fields on the primary or $B_0$ magnetic field. These time varying fields tend to induce eddy currents in the conductors of the rf coil, which in turn may cause mechanical motion of the rf coil.

Yet another source and pathway of acoustic noise is due to vibration of mechanical components in the scanner. It is known in the mechanical arts area to design and use isolation mounts so that vibrations from machinery supported by the isolation mounts are not transmitted to surrounding structure that supports the isolation mounts. Conventional isolation mounts include those of the elastromeric type and those of the spring type. Such isolation mounts are designed by the artisan so that the natural frequency of vibration of the mounts and the machinery is less than the important excitation frequencies of the machinery in order to provide effective vibration isolation.

These techniques or measures to reduce acoustic noise due to the various components in the MRI scanner have been partially effective, but patients and technicians still find the noise in and about a MRI scanner to be problematic. What is needed is a lower noise MRI scanner that addresses the multiple sources and pathways of acoustic noise in and about the scanner.

SUMMARY OF THE INVENTION

A low noise imaging apparatus for producing Magnetic Resonance (MR) images of a subject and for substantially minimizing acoustic noise generated during imaging is provided. The imaging apparatus comprises a magnet assembly, a gradient coil assembly, and a rf coil assembly, wherein at least one of the magnet assembly, the gradient coil assembly and the rf coil assembly are configured to reduce the generation and transmission of acoustic noise in and about the imaging apparatus.

A radiofrequency (rf) coil assembly for a Magnetic Resonance Imaging (MRI) system comprises a plurality of conductors wherein each of the conductors has a width selected for transmitting a radiofrequency pulse, for receiving an MR signal induced in the subject and for reducing eddy current excitation contributing to acoustic noise in and about the imaging apparatus. Further, a layer of acoustic absorptive material may be disposed between the plurality of conductors and a patient bore tube.

A magnet assembly for an imaging apparatus for a Magnetic Resonance Imaging (MRI) system comprises an outer surface and a plurality of suspension members for attaching a magnet to the outer surface. The suspension members are configured to reduce generation and transmission of acoustic noise.

BRIEF DESCRIPTION OF THE DRAWINGS

The features and advantages of the present invention will become apparent from the following detailed description of the invention when read with the accompanying drawings in which.

DETAILED DESCRIPTION OF INVENTION

Figure 1:
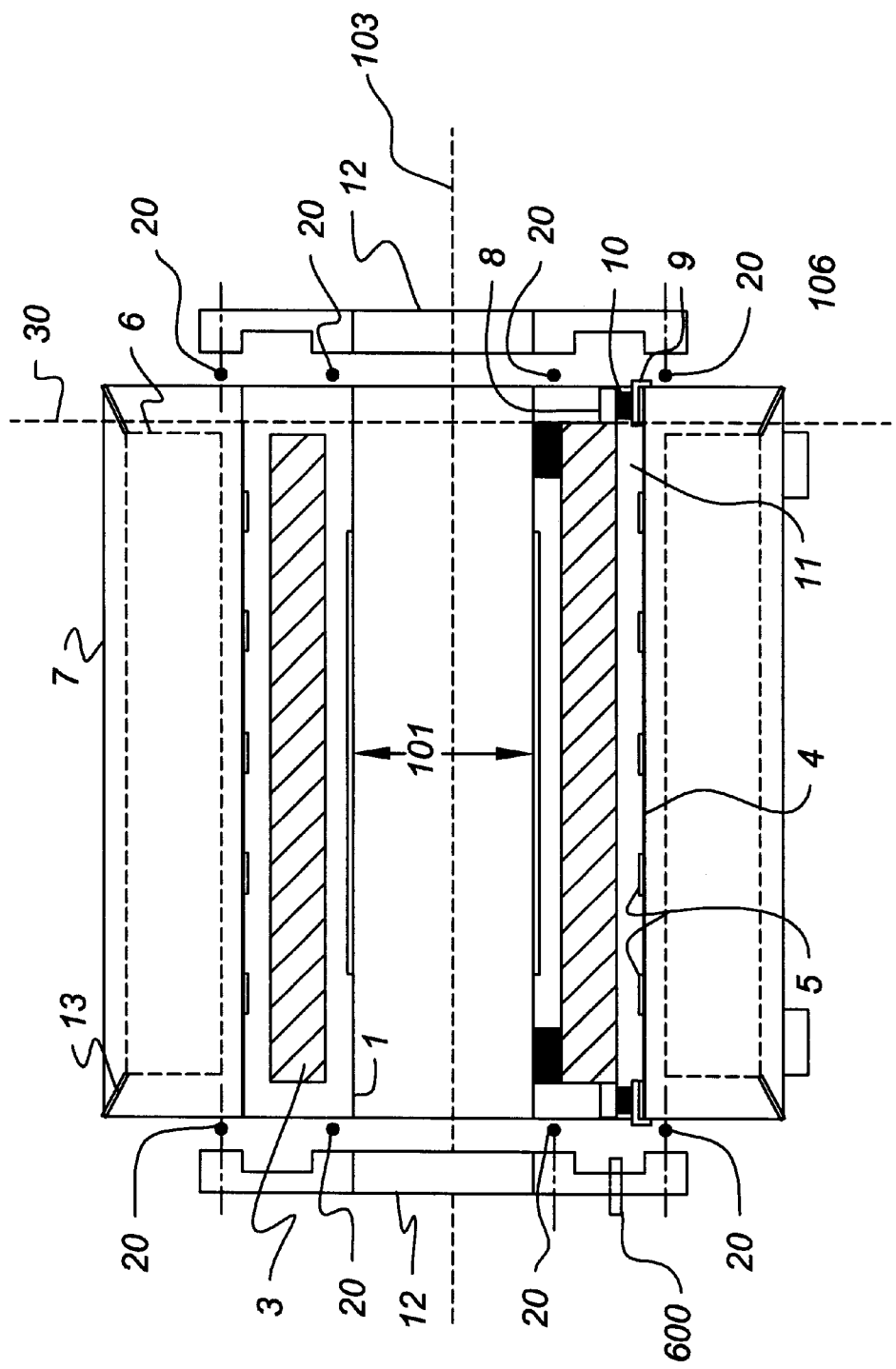
FIG. 1 is a schematic cross-sectional side-elevation view of an imaging apparatus to which preferred embodiments of the present invention are applicable.
Figure 2:
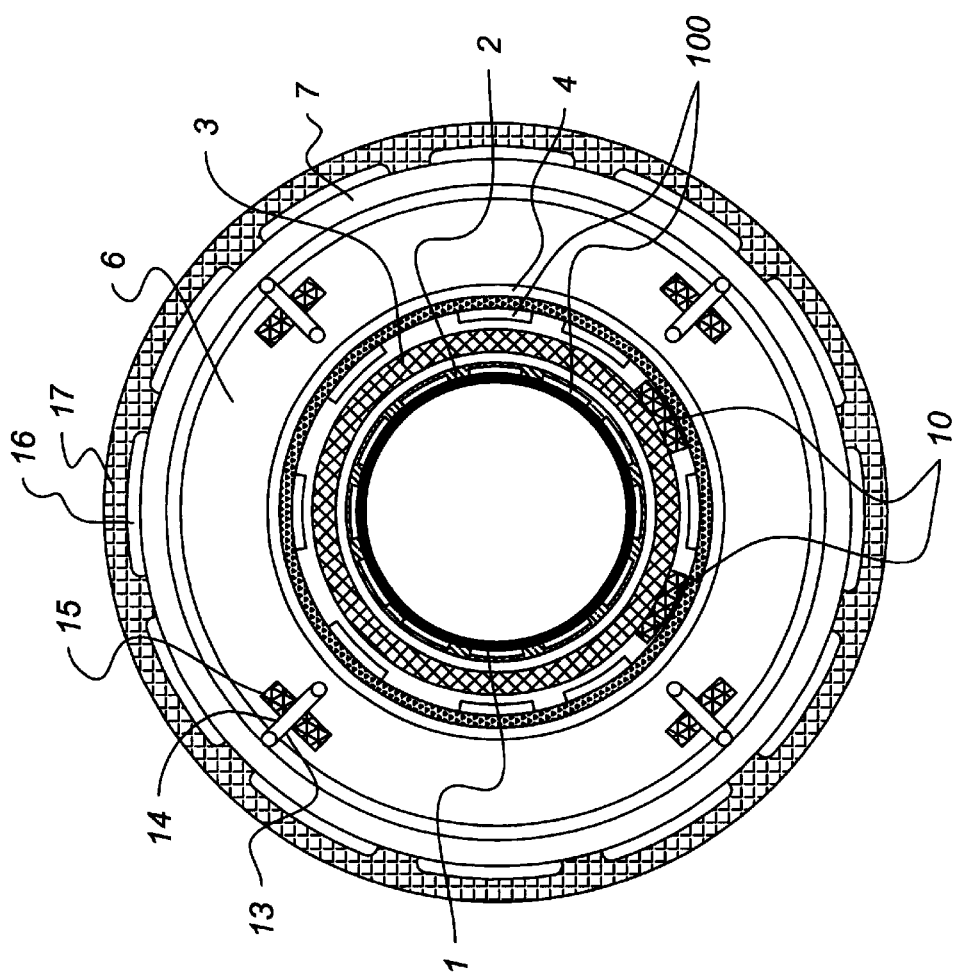
FIG. 2 is a schematic cross-sectional view of the imaging apparatus of FIG. 1 taken along the line 30—30 of FIG. 1.
Figure 3:
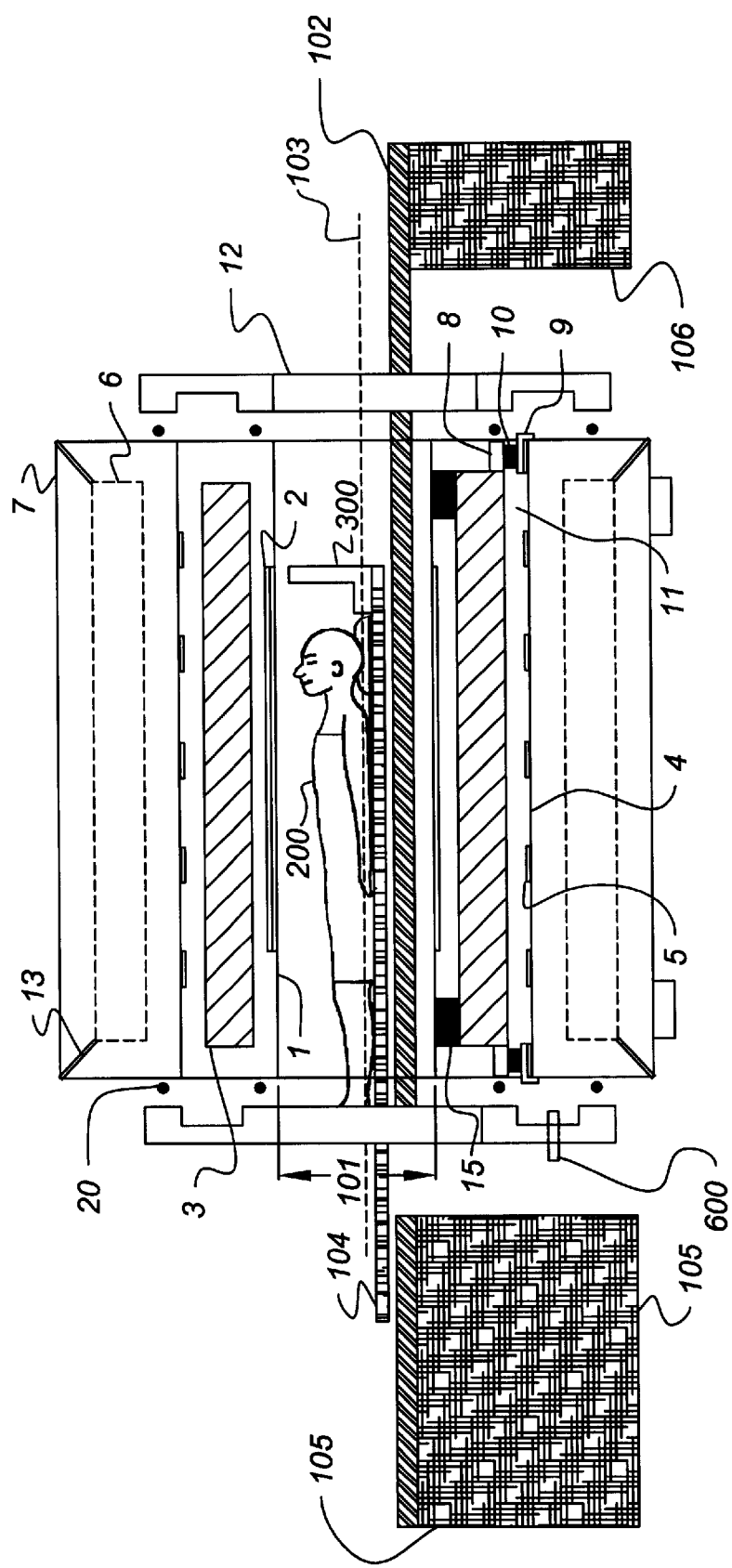
FIG. 3 is a schematic cross-sectional side-elevation view of a MRI scanner to which preferred embodiments of the present invention are applicable.

Referring to FIGS. 1, 2 and 3, there is shown an exemplary imaging apparatus to which embodiments of the present invention are applicable. The imaging apparatus is of a type useful in producing Magnetic Resonance (MR) images of a patient or subject. Throughout the figures, like numerals represent like elements throughout. FIGS. 1, 2 and 3 show a MR system based on a cylindrical superconducting magnet. It is to be appreciated by one skilled in the art that the functions and descriptions of similar components used in an open magnet configuration are applicable for an open magnet MR system.

Referring to FIG. 2, a cross-sectional view of a magnet arrangement of a type commonly used in connection with MR imaging is shown. A magnet assembly is generally cylindrical and annular in shape, and comprises an inner surface referred to as a magnet warm bore 4, passive magnet shims 5 (also shown in FIG. 1), magnet vessel 6 and cryostat shell 7 disposed radially around the outer surface. The magnet assembly further comprises suspension members 13 land end cap seals 20 which will later be described in more detail.

Typically, magnet vessel 6 encloses a superconductive magnet (not shown) that, as is well-known, includes several radially-aligned and longitudinally spaced-apart superconductive main coils, each capable of carrying a large, identical electric current in the same direction. Also, the superconductive main coils are designed to create a magnetic field of high uniformity within a spherical imaging volume centered within the magnet's bore where the object to be imaged is placed. The superconductive main coils produce a main static magnetic field, known as $B_0$, typically in the range from 0.5 T to 8 T. The superconductive main coil is enclosed by magnet vessel 6. Magnet vessel 6 generally includes a helium vessel and thermal or cold shields for containing and cooling the magnet windings in a known manner. Magnet vessel 6 also prevents heat from being transferred to the superconducting magnet. Hereinafter, magnet vessel 6 refers generally to the superconductive main coils described herein, conventional thermal shields, liquid-helium dewars, and the like, being omitted from the figures for clarity. Cryostat shell 7 covers the outer surface of the magnet assembly. Cryostat shell 7 is generally metallic, typically steel or stainless steel.

Referring further to FIG. 2, rf coil assembly 2, gradient coil assembly 3 and the magnet assembly are generally annularly-cylindricall shaped and are generally coaxially aligned, wherein the gradient coil assembly circumferentially surrounds the radiofrequency coil and wherein the magnet circumferentially surrounds the gradient coil assembly. Referring to FIG. 1, a side-elevation view shows the relative placement of each of the components of the imaging apparatus. A patient or imaging subject 200 (not shown, see FIG. 3) is positioned within a cylindrical imaging volume 101 surrounded by patient bore tube 1. Patient or subject 200 is inserted into the imaging apparatus along center axis 103 on a patient table or cradle 105 (not shown, see FIG. 3). Center axis 103 is aligned along tube axis of the magnet assembly parallel to the direction of the $B_0$ magnetic field. Bore tube 1 is desirably made of electrically low- or non-conducting material such as FRP (fiberglass-reinforced plastic). In this embodiment, rf coil assembly 2 is mounted on the outer surface of patient bore tube 1, such as in a conventional birdcage rf coil arrangement, e.g. multiple conductors and capacitive elements spaced apart along outer surface the patient bore tube in order to maintain a uniform radiofrequency (rf) magnetic field. Rf coil assembly 2 is used to apply a radiofrequency magnetic field pulse to patient or subject 200 and to receive MRI information back from subject 200, as is well-known in the art of MR imaging.

Gradient coil assembly 3 is disposed around in a spaced apart coaxial relationship therewith and generates time-dependent gradient magnetic field pulses in a known manner. Radially disposed around gradient coil assembly 3 is the magnet assembly including warm bore 4, magnet vessel 6 and cryostat shell 7 that produces the static magnetic field necessary for producing MRI images, as described above.

Referring further to FIG. 1, warm bore 4 refers general y to the inner cylindrical surface of the magnet assembly. This magnet warm bore is typically made of metal. On the inside cylindrical surface of warm bore 4 are passive magnetic shims 5. Shims 5 are used in a well-known manner to make small adjustments to the static magnetic field. The shims are typically thin iron or steel strips.

Referring further to FIG. 1, the imaging apparatus further comprises a pair of end caps 12 for enclosing the components of the imaging apparatus. End caps 12 hold the patient bore tube 1 in place by fixably attaching end portions of patient bore tube 1 to the magnet assembly. End cap seals 14 act as an airtight seal between end caps 12 and patient bore tube 1, and also maintain vacuuming space 11 for enclosing gradient coil assembly 3. End cap seals 14 are typically made of compliant gasket material having a thickness between $3/4-1$ inch in order to maintain the desired vacuum in vacuum space 11. End cap seals 14 have their elastic properties selected so that they can provide vibration isolation between the magnet cryostat shell 7 and the end caps 12.

Referring to FIG. 3, further components of the imaging apparatus include support structures such as patient couch or cradle 104 in order to insert and position subject 200 into imaging volume 101. Patient cradle 104 is slidable, such as with rollers, in a known manner along bridge 102. Bridge 102 is supported by front bridge support 105 and rear bridge support 106. Each bridge support is fixed to the floor or the magnet assembly. Further, cradle electronics unit is coupled to bridge 102 or cradle 104 to control motion of patient cradle 104.

Gradient coil assembly 3 generally contributes two sources of acoustic noise in an MR imaging system—1) vibrations due to Lorentz (electromagnetic) forces acting on the gradient coils and 2) noise due to Lorentz forces in, electrically conductive parts not in contact with the gradient coil assembly. Gradient coil assembly 3 comprises gradient windings that are typically wires or flat conducting strips shaped into forms that produce desired gradient magnetic fields. The gradient winding wires are in a strong magnetic field and therefore experience a Lorentz force $\vec{I} \times \vec{B}$, where $\vec{I}$ is the current in any section of wire and $\vec{B}$ is the static magnetic field. Further, the currents in the wires are typically as high as several hundred Amps and the static magnetic fields can vary from typically 0.5 T to 8 T. Therefore, the Lorentz forces can be very large and produce significant vibrations of the gradient assembly. These vibrations can in turn displace air and produce audible sound. The gradient assembly vibrations can also be transmitted mechanically through the magnet system structures and can cause vibrations in other parts of the structure and subsequent sound generation. The second source of acoustic noise is generated by Lorentz forces in electrically conductive parts not in contact with the gradient assembly. For example, these forces are produced because the gradient pulsed fields induce eddy currents in various electrically conductive parts of the MRI system, and these eddy currents interact with the static magnetic field to produce $\vec{I} \times \vec{B}$ Lorentz forces as described above.

The rf coil assembly is also a source of acoustic noise in an MR imaging system. Rf coil assembly 2 typically is a large-volume rf coil, mounted in a bird cage configuration, and is made using etched patterns of conductors, and these conductors can typically be a few inches wide. A large-volume rf coil is typically about half the length of the patient bore, is wrapped around the entire circumference of the patient bore tube 1 and is firmly mounted to the patient bore tube 1. The large-volume rf coil, however, is subject to pulsed gradient fields from the gradient assembly 3. These pulsed fields induce eddy currents in the conductors of the large-volume rf coil and the eddy currents, in conjunction with the static magnetic field, produce $\vec{I} \times \vec{B}$ Lorentz forces which cause the patient bore tube 1 to vibrate. These vibrations then produce acoustic noise that can be heard by the patient and system operators.

In an embodiment of an imaging apparatus for producing MR images of a subject, the imaging apparatus comprises a gradient coil assembly, an rf coil assembly and the magnet assembly, and wherein each of the assemblies are selectively configured to reduce the generation and transmission of acoustic noise in and about the imaging apparatus during imaging. Each of the gradient assembly, rf coil assembly, the magnet assembly and other components of a MRI system contributes sources and pathways for acoustic noise. Embodiments are presented to reduce acoustic noise in each of the assemblies. It can be appreciated that for particular applications, features of each embodiment for the assemblies and components may be combined to lower acoustic noise of the imaging apparatus. Alternatively, each of the assemblies may be selectively configured to reduce the generation and transmission of acoustic noise independently. As used herein, "configured to" and the like refer to components having a structure and a capability for performing a stated function.

Gradient coil assembly 3 is desirably configured to reduce vibrations due to Lorentz forces acting on the gradient coils and vibrations due to electrically conductive parts not in contact with gradient coil assembly 3. Typically, the gradient coil assembly has two windings, inner and outer, which are held together by an epoxy filling. In a known manner, the epoxy filling stiffens and increases the weight of the gradient assembly in order to reduce the vibrations and resultant noise. In a first embodiment of gradient coil assembly 3, gradient coil assembly 3 is further mounted within the magnet assembly in a manner to provide further vibration isolation. Referring to FIG. 1, each end of gradient assembly 3 is attached to a bracket 8 and a corresponding bracket 9 is attached to each corresponding end of the magnet. Disposed between brackets 8 and 9 are compliant isolation stacks 10, each having a thickness desirably between 3–10 mm. Compliant isolation stacks 10 provide vibration isolation between the gradient assembly and the magnet mounting the gradient assembly in way that reduces the vibration transmission from the gradient assembly to the magnet or other parts of the MRI system. In a further embodiment of gradient coil assembly 3, gradient coil assembly 3 is further contained in a vacuum 11 which is bounded by the patient bore tube 1, the magnet warm bore 4 and the end caps 12. In order to be effective for acoustic noise reduction, this vacuum is desirably below 200 Torr.

Figure 4:
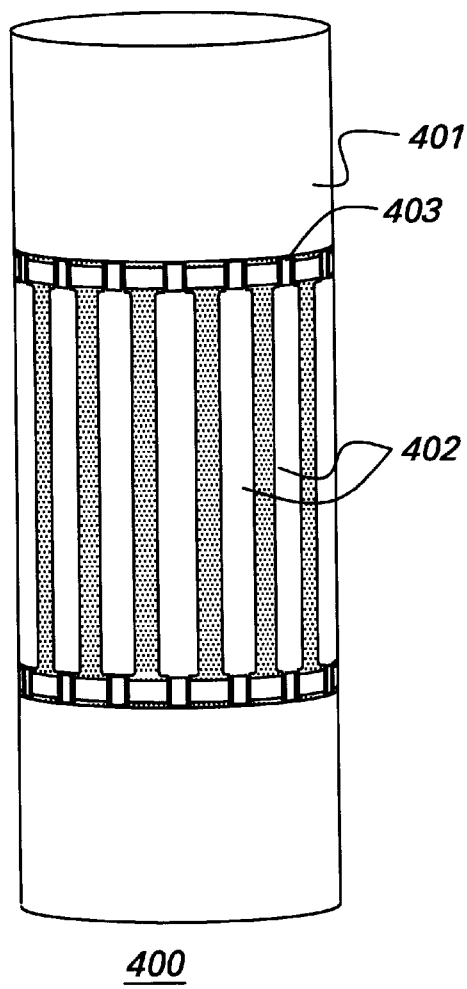
FIG. 4 is a schematic illustration of a rf coil assembly of a type useful in the imaging apparatus of FIGS. 1 and 3.
Figure 5:
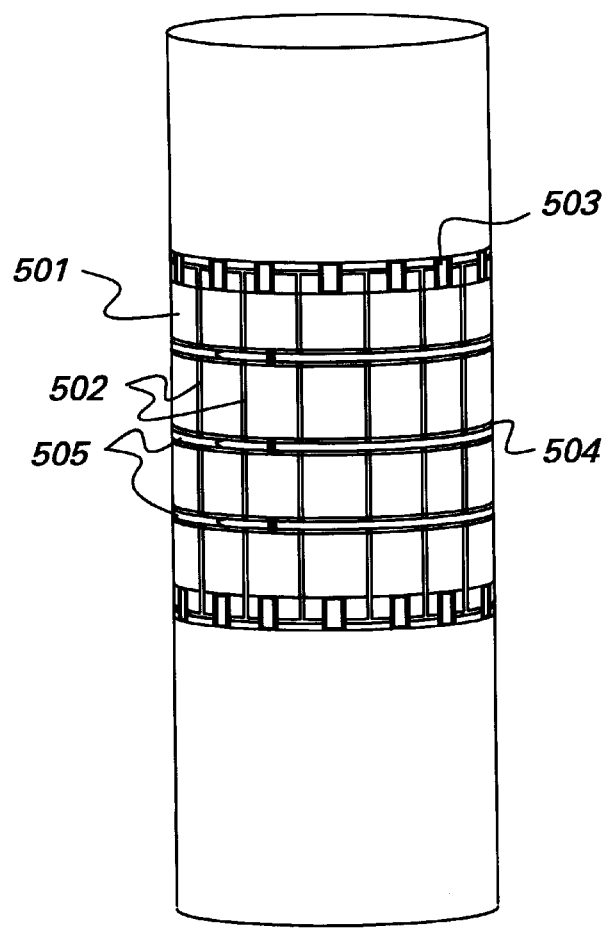
FIG. 5 is a schematic illustration of a rf coil assembly of a type useful in the imaging apparatus of FIGS. 1 and 3; and, FIG. 6 is a schematic illustration of a gradient current feed-through arrangement of a type useful in the imaging apparatus of FIGS. 1 and 3.

Radiofrequency (rf) coil assembly 2 is desirably configured to reduce acoustic noise generated during imaging by alleviating the large-volume rf coil vibration and subsequent noise. FIGS. 4 and 5 show variations of embodiments of a reduced noise rf coil assembly alleviate vibrations, and subsequent noise, due to eddy currents in the conductors of rf coil assembly 2. Referring to FIG. 4, large-volume rf coil 400 comprises 16 conductors 402 wrapped around cylinder 401 (the outer surface of patient bore tube 1 of FIGS. 1, 2 and 3) in a birdcage configuration. Capacitors 403 are provided for resonating the rf coil. In this embodiment, conductors 400 are desirably made narrow so that the area available to excite eddy currents is reduced and the consequent forces are also reduced. The quantity and width of conductors 402 are desirably selected in accordance with desired magnet performance and magnet field uniformity. As used herein, "width" refers generally to a measurement or dimension. Typically, conventional large-volume rf coil conductors are approximately 50 mm wide. In the embodiment shown in FIG. 4, the width of conductors 402 is selected to be less than 50 mm to reduce the area available to excite eddy currents, thereby reducing acoustic noise yet still capable of maintaining desired rf performance. It is to be appreciated that the width is selected to achieve desired rf performance and eddy current reduction. In an alternate embodiment, a layer of an acoustic absorptive material is disposed between conductors 402 and cylinder 401 to minimize vibrations between conductors 402 and cylinder 401.

In another alternate embodiment, noise reduction is achieved by making cuts in the conductors to interrupt the eddy current pattern, thereby leading to a reduction in eddy currents and the associated Lorentz forces.

Referring to FIG. 5, a further embodiment of a rf coil configured to reduce the generation and transmission of acoustic noise is shown. Rf coil assembly 500 comprises 16 conductors 502 made of Cu tubing having an outside diameter of a desirable range from 3 mm to 12 mm. Conductors 502 are placed around cylinder 501 in a birdcage configuration and are coupled to capacitors 503 for resonating the rf coil. Further, conductors 502 are desirably mounted to the outside surface of FRP cylinder 501 (the inner surface houses patient bore tube 1 of FIGS. 1, 2 and 3) in conjunction with vibration isolation material 504 between the conductors and the patient bore tube. Vibration isolation material 504 is desirably constructed of compliant material having a thickness to substantially reduce any gap between conductors 502 and cylinder 501. Straps 505 are used to fixably hold conductors 502 and vibration isolation material 504 in place on cylinder 501.

In a further embodiment of a reduced noise rf coil assembly, the large-volume rf coil is made so that there is no mechanical connection with the patient bore tube. Referring further to FIG. 1, generally patient bore tube 1 couples at its outer surface with rf coil assembly. In this embodiment, rf coil assembly 2 is desirably mounted to avoid contact with patient bore tube 1 and is instead mounted on the inside of gradient assembly 3. In this embodiment, it can be appreciated that acoustic noise from the rf coil assembly is not directly transmitted to the patient bore tube via mechanical means or by air, since it is now entirely contained within vacuum space 11.

In further embodiments of the imaging apparatus, the magnet assembly is desirably configured to reduce generation and transmission of acoustic noise in and about the imaging apparatus. One source of acoustic noise in the magnet assembly is attributed to passive shims 5. Typically, the shims are thin sheets of steel. These sheets of steel may have eddy currents induced in them by pulsed magnetic fields from the gradient assembly and the eddy currents, in conjunction with the static magnetic field, produce $\vec{I} \times \vec{B}$ Lorentz forces as described above which cause the magnet warm bore 4 to vibrate. These vibrations may be transmitted to the outside of the magnet via air (if there is no vacuum) or via mechanical pathways through the cryostat to the patient bore tube. Subsequent vibrations of the outside of the magnet cryostat or patient bore tube produce substantial acoustic noise that is heard by the patient and the MRI system operators.

Referring to FIG. 1, in a first embodiment of the magnet assembly for reduced noise, passive shims 5 are desirably made of finely-divided magnetic material that is mixed with a non-conducting polymer such as epoxy and then molded into sheets. In this embodiment, shims 5 are desirably constructed with a 100 mesh steel powder (Ancorsteel 300 SC) and polyethylene (Dowlex 2045, density $\rho_{PE}$=0.92 g/cm$^3$) mixed, pressed to thicknesses ranging from 0.25–1.3 mm and cut into strips. These sheets have magnetic properties to permit magnetic shimming, but the electrically low- or non-conducting shim material desirably does not support eddy currents and thus shims 5 will not vibrate when subjected to pulsed gradient fields. In a second embodiment, passive shims 5 are desirably vibrationally isolated from the magnet warm bore. In one embodiment, a layer of vibration isolation material is disposed between the shims and the magnet bore. In this embodiment, further transmission of any energy of vibrations from shims to magnet warm bore is desirably reduced.

The warm bore of the magnet assembly is also a source of acoustic noise. The magnet warm bore is typically composed of electrically conductive material and therefore can also support eddy currents generated by pulsed gradient magnetic fields. Consequent vibration of the warm bore can create acoustic noise that is carried by air or by mechanical vibrations to the patient or MRI system operators.

In further embodiments of the magnet assembly for reduced acoustic noise, magnet warm bore 4 is configured to reduce generation and transmission of acoustic noise. In one embodiment, magnet warm bore 4 is desirably made of non-electrically conductive material, for example, FRP (fiberglass-reinforced plastic). In a further embodiment, a vacuum surrounding the magnet warm bore prevents sound from being carried from the magnet warm bore by means of air. The seal between the magnet warm bore and the rest of the magnet structure can be made to carry out vibration isolation as well as a vacuum seal. If the seal can vibrationally isolate the warm bore from the rest of the magnet structure, then vibrations induced in the warm bore by gradient magnetic field pulses will not be carried mechanically to the outside of the cryostat shell 7. Thus, isolating the magnet warm bore via vacuum plus isolating the magnet warm bore by mechanical isolation can desirably prevent or decrease the ability of vibrations of the warm bore to produce acoustic noise which would be audible to the patient or MRI system operator. In another further embodiment the FRP is desirably coated with a very thin (microns or submicrons thick) metallic layer (metallized) in order to decrease penetration of gases and water from the atmosphere through the surface of the warm bore. If the metallic layer is made sufficiently thin (microns or submicrons thick), then eddy currents will be substantially minimized in the metallic layers and so will consequent eddy-current-induced vibrations.

Referring further to FIG. 2, a further embodiment of the magnet assembly comprises suspension members 13 configured to reduce transmission of acoustic noise. Magnet vessel 6 is connected to cryostat shell 7 by thin suspension members 13. These members are typically designed to minimize heat flow from cryostat shell 7 to magnet vessel 6, including the superconducting magnet. In this embodiment, suspension members 13 are constructed to desirably vibrationally isolate magnet vessel 6 from cryostat shell 7. In this embodiment, suspension member 13 comprises a blocking mass 15 attached to the middle of suspension straps 14. Blocking mass 15 is made of electrically non-conducting material. Straps 14 can be constructed of carbon fiber material, as is well known. Transmission of high frequencies along suspension members 13 is desirably reduced by attaching mass 15 to the middle of the suspension members, thus creating a vibrational impedance mismatch that will tend to reflect energy traveling along the suspension members.

Further embodiments of the magnet assembly include embodiments of cryostat shell 7 that reduce acoustic noise attributable to the cryostat shell. The cryostat shell is generally metallic, typically steel or stainless steel. Vibrations of the cryostat shell, whether as a direct electromagnetic excitation from the pulsed gradient magnetic fields or as a result of mechanically transmitted vibrations originating somewhere else in the apparatus, can result in acoustic noise that is heard by the patient or MRI system operator.

In a further embodiment, cryostat shell 7 is desirably made of non-electrically-conductive materials such as FRP. In another further embodiment the FRP is desirably coated with a very thin (microns or submicrons thick) metallic layer (metallized) in order to decrease penetration of gases and water from the atmosphere through the cryostat shell. If the metallic layer is made sufficiently thin (microns or submicrons thick), then eddy currents will be substantially minimized in the metallic layers and so will consequent eddy-current-induced vibrations.

Referring further to FIG. 2, in a further embodiment, cryostat shell 7 is covered by a layer 17 of acoustic material which blocks and absorbs potential vibrations thus preventing acoustic noise emissions to the room and patient bore 101. Layer 17 is a material such as open-cell foam designed for acoustic absorption such as "Soundfoam" by Soundcoat Company, and in this embodiment is approximately 6 mm to 13 mm in thickness. Further disposed between layer 17 and cryostat shell is a layer of constrained-layer-damping (CLD) desirably applied as strips to the cryostat shell. CLD generally consists of a thin plate with an acoustically damping material applied to it. The CLD material is applied to the structure to be damped (cryostat shell 7) so that the damping material is sandwiched between the thin plate and the structure. As vibrations are conveyed through the structure, the structure flexes, and the consequent shear between the structure and the thin plate produces damping in the sandwiched acoustic damping material. This material can be effective in removing the effects of mechanical resonances, which often tend to increase sound levels. In another further embodiment, CLD material 100 is applied to the inner surface of warm bore 4. In another further embodiment, CLD material 100 is applied to the inner and/or outer surfaces of gradient assembly 3.

Further alternate embodiments of the magnet assembly involve mounting arrangements to prevent vibrations and resulting acoustic noise. For example, vibrations of the cryostat shell can also be conveyed to the patient bore tube via the mechanical path from cryostat shell 7 to end caps 12 to patient bore tube 1. In an embodiment for mounting the magnet assembly, the mechanical path is desirably broken up by ensuring that seals 14 between end caps 12 and cryostat shell 7, which maintains the vacuum around the gradient assembly, also serves as vibration isolation. In this embodiment, vibrations from the cryostat will be prevented from being transmitted to the patient bore tube. Seals 14 are selected to provide isolation between cryostat shell 7 and end caps 12. An embodiment includes seals 14 made of O-ring material such as Durometer 40 Buna-N rubber or other such materials.

Referring further to FIG. 2, in a further embodiment, patient bore tube 1 includes a layer of acoustic absorptive material, such as "Soundfoam" disposed on it inner surface. Patient bore tube is typically made of a rigid, electrically low- or non-conducting material such as FRP (fiberglass-reinforced plastic). Patient bore tube 1 may have mechanical resonances that would tend to amplify vibrations conveyed to the patient tube via mechanical contact or air. In a further embodiment, damping can be introduced to the patient tube resonances by applying non-conducting constrained-layer damping (CLD) 100 as in strips to the outer or inner surface of patient bore tube 1.

Figure 6:
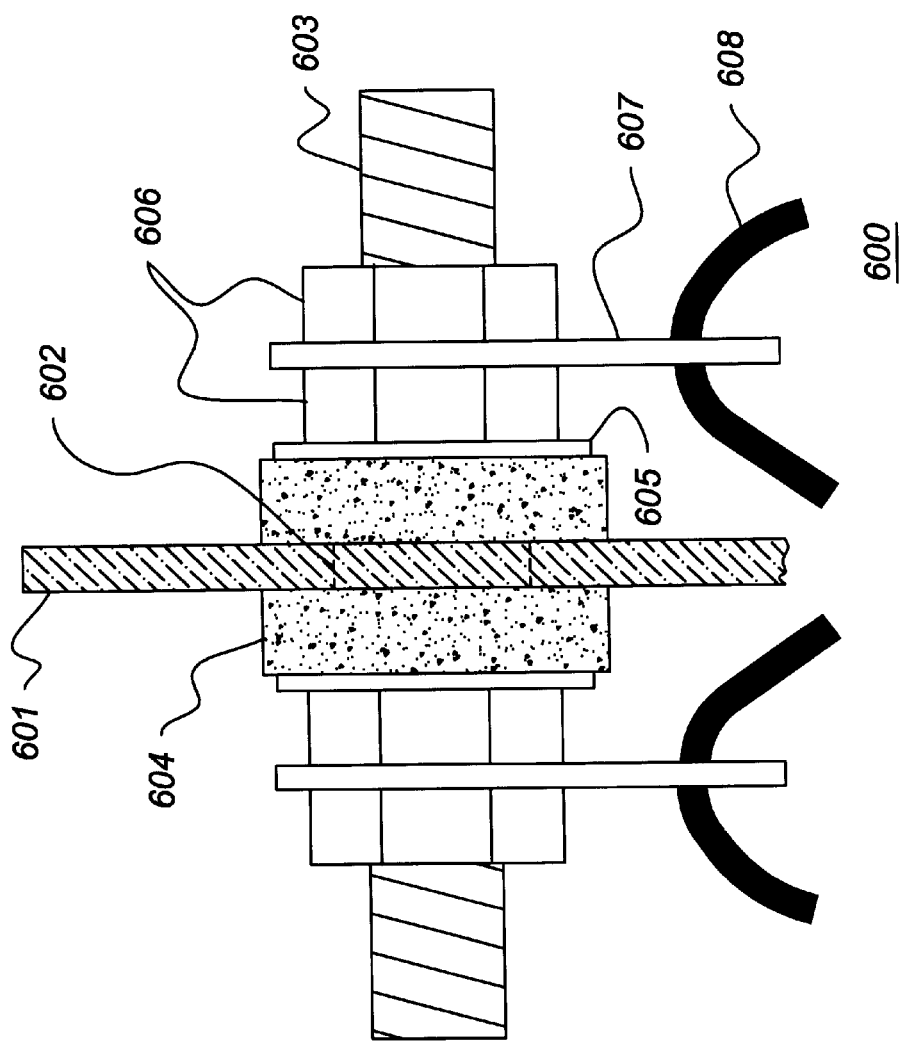

Referring to FIG. 6, there is shown a further embodiment for reducing a source of acoustic noise due to the leads that power the gradient coils. The leads that power the gradient coils carry large currents, typically 200 A or more and may therefore be subjected to large Lorentz forces. Referring to FIG. 1, leads or wires (not shown) pass through one of end caps 12 via gradient feed-through assembly 600. These leads must go from an external power supply to the gradient assembly and therefore must penetrate the vacuum enclosure. The large Lorentz forces on the gradient leads undesirably cause the wires to vibrate. If the gradient lead feed-through assemblies are rigidly attached to end caps 12, the forces on the gradient leads may cause the end caps to vibrate. This is undesirable since vibration of the relatively large-area end caps may then move a large volume of air and create a high-intensity sound.

Referring further to FIG. 6, gradient feed-through assembly 600 is constructed to alleviate the problem of transferring vibrations to end caps 12. In this embodiment, clearance hole 602 is provided on end cap wall 601 to allow for power from an external power supply to pass through end cap wall 601. Threaded rod 603 goes through clearance hole 602 and rubber disks 604, and threaded rod 603 serves as a conductor for the current that is passed from wires 608 attached through lugs 607. Thus, wires 608, lugs 607 and threaded rod 603 serve as the conduction path for the power. Further, washers 605 and nuts 606 are provided to secure feed-through assembly 600 to the surface end cap wall 601, and nuts 606 also serve as part of the conduction path. Adjacent to each side of end cap wall 601 is pair of isolation devices 604, made of an electrically insulating material such as, for example, soft, tightly-fitting rubber spacers. Desirably, the rubber isolating material enables the feed-through assembly to have a small range of motion, in and out and tilting, thereby reducing vibration and subsequent acoustic noise. Also, isolation devices 604 also serve to produce an airtight seal in order to maintain the vacuum.

Referring to FIG. 3, a further source and pathway of acoustic noise can be attributed to cradle electronics unit 300, the electronics unit used to interface the signals from various rf coils to the system electronics which are typically located external to the scanner. Typically, cradle electronics unit 300 contains electronic modules with metal parts that in turn may produce eddy currents when subjected to the pulsed imaging gradients, and these eddy currents may cause vibration and consequent sound generation. Some typical electronic modules might be preamplifiers or other electronic circuits contained in metal boxes, typically with dimensions of about 50 mm or larger. If these electronics are rigidly bolted onto some electronics-carrying carriage that is attached to patient couch 104 or is otherwise introduced into the imaging volume during imaging, then vibrations of the electronics may vibrate the cradle or couch. Since the cradle may have relatively large surface area, its vibration may efficiently produce acoustic sound. Therefore it is desirable to vibrationally isolate the electronics and to prevent any sound from the electronics from reaching the patient or system operator.

In a further embodiment, it is desirable to isolate the electronic modules in unit 300 by placing them on vibration absorbing or isolating material such as rubber pads inside unit 300, so that the rubber tends to prevent vibrations of the electronics from reaching the carriage. Additionally, sound-absorbing material, such as closed-cell acoustic foam or fiberglass batting, may be wrapped around the control unit 300.

It will be understood by those skilled in the art that the invention has been described with reference to the preferred embodiments, but that the invention is not limited to these embodiments. Those skilled in the art will understand that modifications can be made to the embodiments discussed above which are within the scope of the invention.

What is claimed is:

1. An imaging apparatus for producing Magnetic Resonance (MR) images of a subject contained within a patient bore tube defining an imaging volume and for substantially minimizing acoustic noise generated during imaging, said apparatus comprising:

a magnet assembly for producing a static magnetic field;

a gradient coil assembly disposed within a vacuum enclosure within said magnet assembly for generating a magnetic field gradient for use in producing MR images; and, a radiofrequency (rf) coil assembly contained between said gradient coil assembly and said patient bore tube for transmitting a radiofrequency pulse and for receiving an MR signal induced from said subject, said rf coil assembly having a plurality of conductors for transmitting a radiofrequency pulse, for receiving an MR signal induced in said subject, said conductors having respective widths selected for reducing eddy current excitation contributing to acoustic noise within said imaging apparatus.

2. The imaging apparatus of claim 1 wherein said magnet coil assembly, said gradient coil assembly and said rf coil assembly are each generally annularly, cylindrically shaped.

3. The imaging apparatus of claim 1 wherein said vacuum is between about 0.1 and about 200 Torr.

4. The imaging apparatus of claim 1 wherein said conductors comprise Cu tubing having an outside diameter of approximately 3 mm to 12 mm.

5. The imaging apparatus of claim 1 wherein said conductors comprise Cu strips and said respective width is less than approximately 50 mm.

6. The imaging apparatus of claim 1 further comprising a pair of end caps for mounting respective ends of said patient bore tube to respective ends of said magnet assembly.

7. The imaging apparatus of claim 6 further comprising end caps seals disposed between said end caps to said respective ends of said patient bore tube and said magnet assembly.

8. The imaging apparatus of claim 6 wherein a sealed gap is disposed between said end caps and said respective ends of said patient bore tube and said magnet assembly.

9. The imaging apparatus of claim 1 wherein said rf coil assembly is mounted so that it has a spaced apart relationship with said patient bore tube.

10. The imaging-apparatus of claim 1 wherein said gradient coil assembly further comprises a vibration isolating feed-through assembly for gradient leads from an external power supply.

11. The imaging apparatus of claim 1 wherein said magnet assembly is an open magnet.

12. A magnet assembly for an imaging apparatus for a Magnetic Resonance Imaging (MRI) system, wherein said system is provided with a generally annular and cylindrical main magnet for generating a static magnetic field, a gradient coil assembly located within an inner surface of said magnet for generating magnetic field gradient for use in producing MR images, and a rf coil assembly disposed within said gradient coil assembly for transmitting a radiofrequency pulse and for receiving an MR signal induced from a subject to be imaged in said imaging apparatus, said magnet assembly comprising:

an outer surface; and, a plurality suspension members for attaching said magnet to said outer surface, said suspension members being constructed to isolate vibration of said magnet to reduce generation and transmission of acoustic noise.

13. The imaging apparatus of claim 12 further wherein said suspension members each comprise a blocking mass attached to a suspension strap for isolating vibration of the magnet assembly.

14. The imaging apparatus of claim 12 wherein said outer surface comprises a non-conducting material.

15. A radiofrequency (rf) coil assembly for an imaging apparatus for a Magnetic Resonance Imaging (MRI) system, wherein said system is provided with a generally annular and cylindrical main magnet for generating a static magnetic field, a gradient coil assembly located within an inner surface of said magnet for generating magnetic field gradient for use in producing MR images, and said rf coil assembly is disposed within said gradient coil assembly for transmitting a radiofrequency pulse and for receiving an MR signal induced from a subject to be imaged in an imaging volume of said imaging apparatus, said rf coil assembly comprising:

a plurality of conductors having a width selected for transmitting a radiofrequency pulse, for receiving an MR signal induced in said subject and for reducing eddy current excitation contributing to acoustic noise in and about said imaging apparatus, said plurality of conductors being constructed of Cu tubing having an outside diameter of approximately 3 mm to 12 mm; and, a layer of vibration isolation material disposed between said plurality of conductors and a patient bore tube, said patient bore tube being for receiving said subject into said imaging volume.

16. The imaging apparatus of claim 15 further comprising a plurality of straps to hold said conductors and said layer of vibration isolation material fixably on said patient bore tube.

17. A radiofrequency (rf) coil assembly for an imaging apparatus for a Magnetic Resonance Imaging (MRI) system, wherein said system is provided with a generally annular and cylindrical main magnet for generating a static magnetic field, a gradient coil assembly located within an inner surface of said magnet for generating magnetic field gradient for use in producing MR images, and said rf coil assembly is disposed within said gradient coil assembly for transmitting a radiofrequency pulse and for receiving an MR signal induced from a subject to be imaged in an imaging volume of said imaging apparatus, said rf coil assembly comprising:

a plurality of conductors having a width selected for transmitting a radiofrequency pulse, for receiving an MR signal induced in said subject and for reducing eddy current excitation contributing to acoustic noise in and about said imaging apparatus, said conductors being constructed of Cu strips and said width is less than approximately 5 mm; and, a layer of vibration isolation material disposed between said plurality of conductors and a patient bore tube, said patient bore tube being for receiving said subject into said imaging volume.

* * * * *